United States Patent
Kogasumi (10) Patent No.: US 8,773,154 B2
(45) Date of Patent: Jul. 8, 2014

(54) MOUNTING STRUCTURE FOR A CONTINUITY TESTING UNIT

(75) Inventor: Kozo Kogasumi, Makinohara (JP)

(73) Assignee: Yazaki Corporation, Tokyo (JP)

( * ) Notice: Subject to any disclaimer, the term of this patent is extended or adjusted under 35 U.S.C. 154(b) by 164 days.

(21) Appl. No.: 13/137,010

(22) Filed: Jul. 15, 2011

(65) Prior Publication Data

US 2012/0025044 A1 Feb. 2, 2012

(30) Foreign Application Priority Data

Jul. 29, 2010 (JP) ................. 2010-170723

(51) Int. Cl.
*G01R 1/067* (2006.01)
(52) U.S. Cl.
USPC ............. 324/755.01; 324/754.01; 324/76.11
(58) Field of Classification Search
USPC .......... 248/220.42; 324/538, 755.01, 754.01, 324/76.11
See application file for complete search history.

(56) References Cited

U.S. PATENT DOCUMENTS

| 8,410,807 B2* | 4/2013 | Umemura et al. | ....... 324/755.01 |
| 8,502,550 B2* | 8/2013 | Kogasumi | ................ 324/755.01 |
| 2012/0019259 A1* | 1/2012 | Kogasumi | .................... 324/538 |

FOREIGN PATENT DOCUMENTS

| JP | 2000-188167 A | 7/2000 |
| JP | 3446675 B2 | 3/2001 |
| JP | 2007-085926 A | 4/2007 |
| WO | WO-2006/117989 A1 | 11/2006 |

OTHER PUBLICATIONS

Office Action dated Apr. 30, 2012, issued for the corresponding Portuguese patent application No. 105831 and its English summary provided by the foreign associate.
Office Action dated Nov. 19, 2013, issued for the corresponding Chinese patent application No. 201110214647.0.

* cited by examiner

*Primary Examiner* — Todd M Epps
(74) *Attorney, Agent, or Firm* — Edwards Wildman Palmer LLP (57) ABSTRACT

A mounting structure for a continuity testing unit is provided in which the plurality of continuity testing units can easily be mounted to or removed from a test board without using the bolt or the intricately-shaped pin, and which improves the efficiency of restoring the mounting arrangement of the continuity testing units. The mounting structure for a continuity testing unit includes a plurality of parallely-arranged rails arranged at a frame, a joint block arranged on the respective rails and a plurality of continuity testing units each including a plate portion and a pin portion arranged at the plate portion. The joint block includes a plurality of holes into which the pin portion is fitted in a disengageable manner. The plurality of holes is arranged in two lines. The plate portion is placed on the joint blocks on the two adjacent rails.

12 Claims, 6 Drawing Sheets

MOUNTING STRUCTURE FOR A CONTINUITY TESTING UNIT

CROSS REFERENCE TO RELATED APPLICATION

The priority application Japanese Patent Application No. 2010-170723 upon which this patent application is based is hereby incorporated by reference.

BACKGROUND OF THE INVENTION

1. Field of the Invention

The present invention relates generally to a mounting structure for a continuity testing unit. More specifically, the present invention is directed to a mounting structure for a continuity testing unit in which a plurality of continuity testing units used to perform a continuity test for respective connectors of a wire harness are arranged in a matrix on a test board.

2. Description of the Related Art

Figure 10:
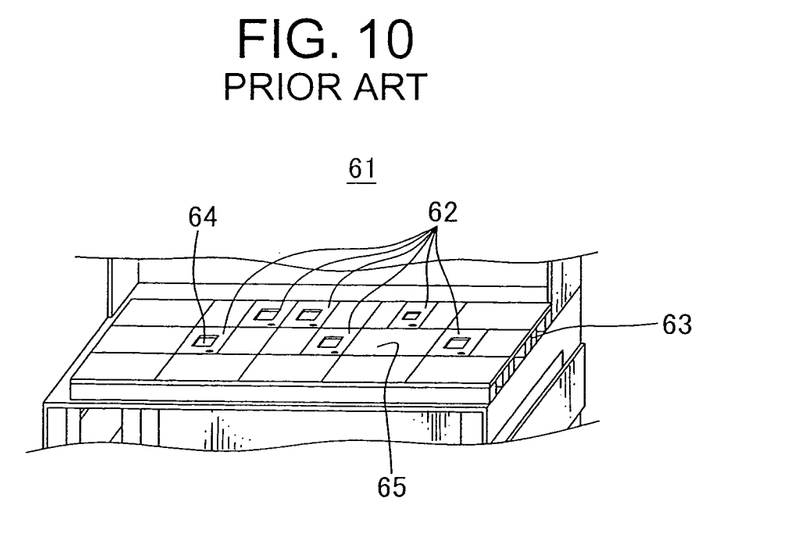
FIG. 10 is an illustration of a conventional mounting structure for a continuity testing unit.

A conventional mounting structure for a continuity testing unit is disclosed in Japanese Patent Application Publication No. 2007-85926 and is shown in FIG. 10. This conventional mounting structure for a continuity testing unit includes a test board 61 having a plurality of rails 63 arranged parallel to each other. A plurality of continuity testing units 62 used to test an electrical continuity of a connector of a wire harness is mounted to the rail 63 via a pin (not shown). The rail 63 is provided with a groove arranged along a lengthwise direction of the rail 63. The pin includes a tip portion arranged to open outward to engage with the groove of the rail 63.

The continuity testing unit 62 includes a plate portion indicated by the sign 62, a connector mounting part (not shown) communicated with a connector insertion aperture 64 formed on the plate portion 62, a testing part having a probe pin arranged to move up into and down out of the connector mounting part and an air cylinder arranged to move the testing part up and down. In FIG. 10, there is also shown a dummy plate 65 having no connector insertion aperture 64.

In operation, the respective connectors of the wire harness is inserted into the respective connector insertion apertures 64 downwardly by a worker. Then a test-start button is pushed by the worker to move the probe pin upward to so that the probe pin is placed in contact with a terminal of an electric wire within the connector. Thus, the probe pin, an electric wire connected to the probe pin, the terminal and the electric wire connected to the terminal together form a closed circuit, so the electrical continuity is detected.

Another example of a conventional mounting structure for a continuity testing unit is disclosed in Japanese Patent No. 3446675 in which a continuity test board includes a plurality of connector insertion apertures, and a continuity testing unit is mounted under or inside the connector insertion aperture. The continuity test board also includes a control part and a test-result indication part.

However, the above-described conventional mounting structure for a continuity testing unit uses the intricately-shaped pin having the tip portion arranged to open after being inserted into the groove of the rail 63. Thus, the use of such intricately-shaped pin causes an increase in cost. Although it is possible to use a bolt and a threaded hole instead of the above-described pin and the groove, it requires more time to attach or remove the bolt and it also requires a separate fixation tool. In addition, although the pin can be fixed to anywhere in the groove of the rail 63, it is difficult to restore the exact mounting position of the continuity testing unit 62.

SUMMARY OF THE INVENTION

In view of the above-described problems, an object of the present invention is to provide a mounting structure for a continuity testing unit in which the plurality of continuity testing units can easily be mounted to or removed from the test board without using the bolt or the intricately-shaped pin, and in which the efficiency of restoring the mounting arrangement of the continuity testing units can be improved.

In order to achieve the above-mentioned object, the present invention provides a mounting structure for a continuity testing unit, including: a frame; a plurality of rails arranged parallel to each other at the frame; a joint block arranged on each of the rails; and a plurality of continuity testing units each including a plate portion and pin portions, wherein the pin portion is arranged on both sides of the plate portion of the continuity testing unit, wherein the joint block is provided with a plurality of holes into which the pin portion is fitted in a disengageable manner, the plurality of holes being arranged in two lines, and wherein the each side of the plate portion is placed on each of the joint blocks arranged on the adjacent two rails.

According to the present invention described above, by fitting the pin portion of the plate portion of the continuity testing unit into the hole of the joint block, the continuity testing unit can be fixed at and removed from the joint block easily with improved workability. In addition, the mounting arrangement (position) of the continuity testing unit can be determined by the holes, thus the mounting arrangement of the continuity testing unit can be restored more easily and accurately. Furthermore, a back face of the plate portion of the continuity testing unit is arranged to contact with (supported by) a front face of the joint block, so the pin portion of the plate portion can be separated from the hole of the joint block by, for example, lifting the plate portion of the continuity testing unit upward (i.e. in a removal direction), and thus the continuity testing unit can easily be removed from the joint block. Furthermore, the plate portions of the continuity testing units are arranged adjacent to each other on both sides with respect to a widthwise center of the rail. Specifically, in one exemplary embodiment described in detail below, the pin portions located on the right side of the plate portion on the left as well as the pin portions located on the left side of the plate portion located on the right are press-fitted into two holes of the joint block in the respective lines, respectively. Thus, such arrangement of the plate portions can downsize the test board, thereby downsizing the mounting structure for a continuity testing unit. The continuity testing unit is a known continuity testing unit provide with a connector mounting part and a continuity testing part having a probe pin. In addition, for the joint blocks located at both ends of the frame may include the holes arranged in a single line. In addition, a dummy plate may be used as the plate portion to cover a space where no continuity testing unit is placed. Furthermore, the cost of the mounting structure for a continuity testing unit can be reduced by employing the above-described simple fixation structure including the pin portion and the hole instead of the conventional intricately-shaped pin. In such manner as described above, the mounting structure for a continuity testing unit according to the present invention is advantageous in effectively mounting or removing the continuity testing unit. Furthermore, since the respective continuity testing units arranged corresponding to the respective connectors of the wire harness can be mounted to or removed from the test board with improved workability, the efficiency of the continuity test for the different types of the wire harness can be improved.

Furthermore, for the mounting structure for a continuity testing unit described above, the pin portion may be arranged at four corners of the plate portion of the continuity testing unit.

According to the present invention described above, the plate portion, i.e. the continuity testing unit, is fixed to the joint blocks on the respective rails via the four corners of the plate portion. Thus, the plate portion of the continuity testing unit can be reliably and firmly fixed at the joint blocks. Consequently, the insertion and the separation of the connector into and from the continuity testing unit can be performed more easily and accurately.

Furthermore, for the mounting structure for a continuity testing unit described above, the joint block may be provided with an engagement portion that slidably engages with a groove of the rail.

According to the present invention described above, the joint block can be easily attached to and separated from the groove of the rail in a sliding manner. Thus, the frame, the rails and the joint bocks can be assembled together in an efficient and easy fashion.

Furthermore, for the mounting structure for a continuity testing unit described above, the joint block may include a plurality of block portions and a connecting portion connecting the block portions to each other at an equal interval, wherein the block portion includes the holes on the front and the rear sides and/or the right and the left sides of the block portion.

According to the present invention described above, for example, the pin portion located on the rear side of a front plate portion and the pin portion located on the front side of a rear plate portion located adjacent to the front plate portion are fitted into the hole located on the rear side of the block portion and the hole located on the front side of the same block portion, respectively. In such a manner described above, the adjacent plate portions can be arranged close to each other. Thus, the block portion serves as a guide for a worker in memorizing the positional arrangement of the plate portions. That is, if there are provided similarly-arranged holes arranged at an equal interval, it is difficult for the worker to memorize the position of the holes; however in the present invention, it is the block portions that are arranged at an equal interval not the holes. Thus, it is easy for the worker to restore the positional arrangement of the plate portion on the joint blocks, thereby improving the efficiency of restoring of the mounting arrangement of the plate portion of the continuity testing unit.

DETAILED DESCRIPTION OF THE INVENTION

One embodiment of a mounting structure for a continuity testing unit according to the present invention is described below with reference to FIGS. 1 through 7.

Figures 1A, 1B:
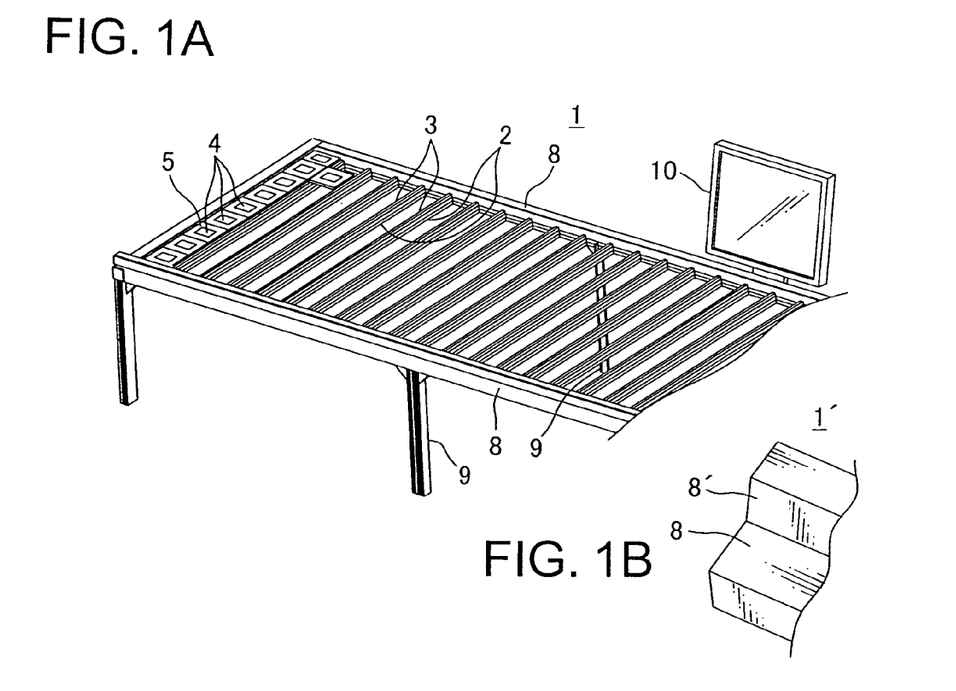
FIG. 1A is an illustration of one embodiment of a mounting structure for a continuity testing unit according to the present invention.
FIG. 1B is an illustration of a modified embodiment of a test board of the mounting structure for a continuity testing unit.
Figure 2:
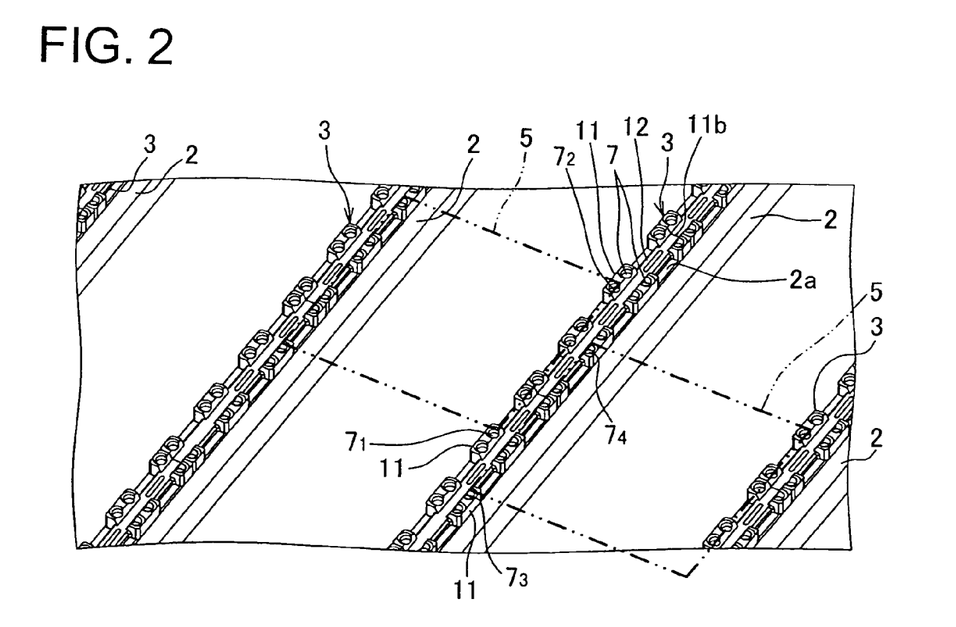
FIG. 2 is an illustration showing a rail and a joint block of the mounting structure for a continuity testing unit.
Figure 3:
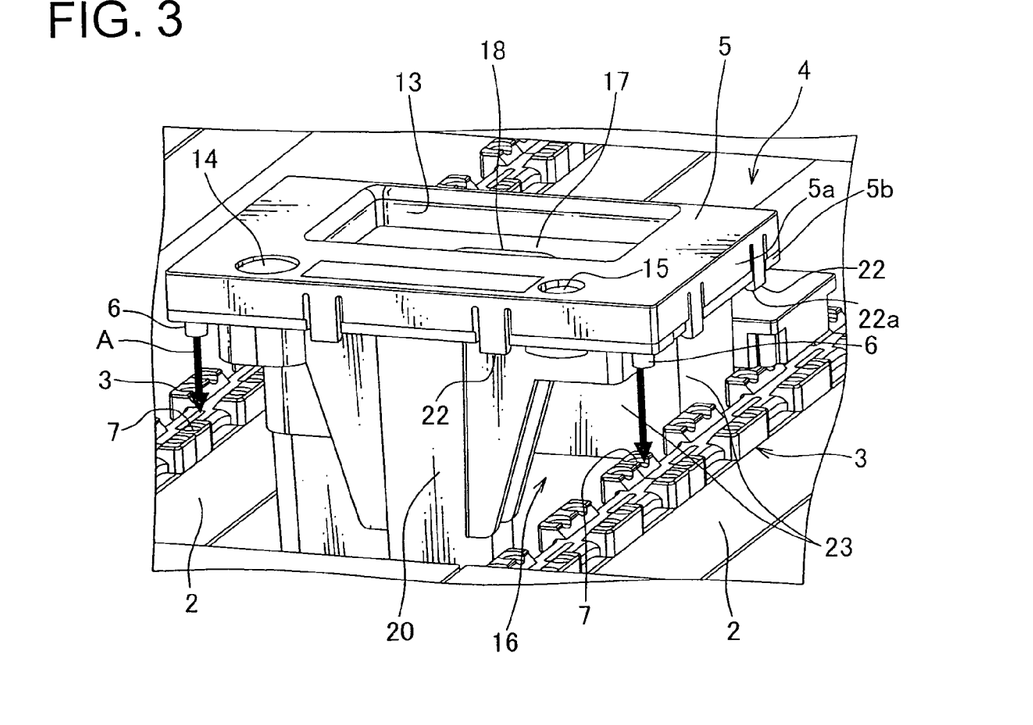
FIG. 3 is an illustration of the mounting structure for a continuity testing unit showing a continuity testing unit to be mounted.
Figure 4:
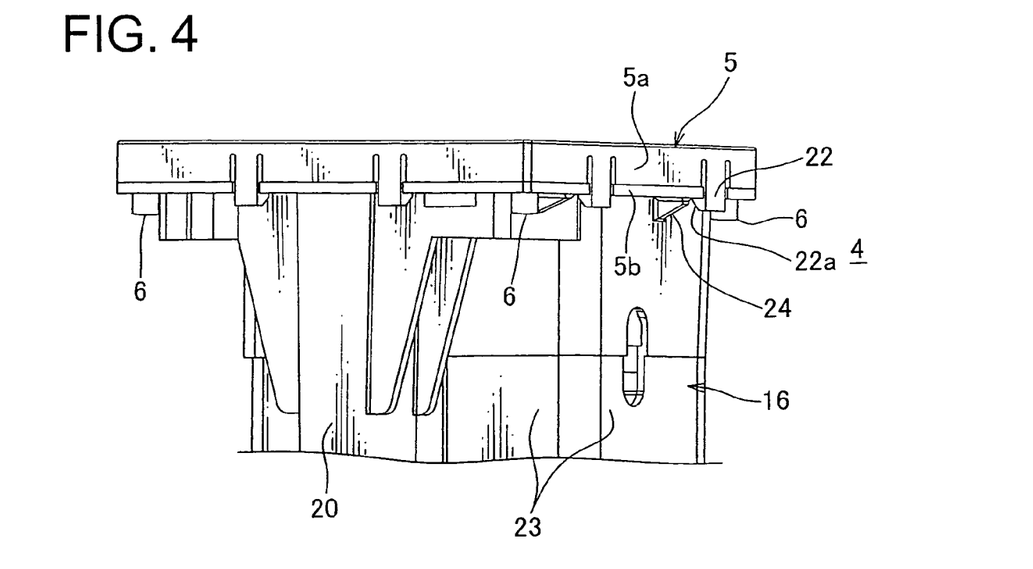
FIG. 4 is an illustration of one embodiment of the continuity testing unit according to the present invention.
Figure 5:
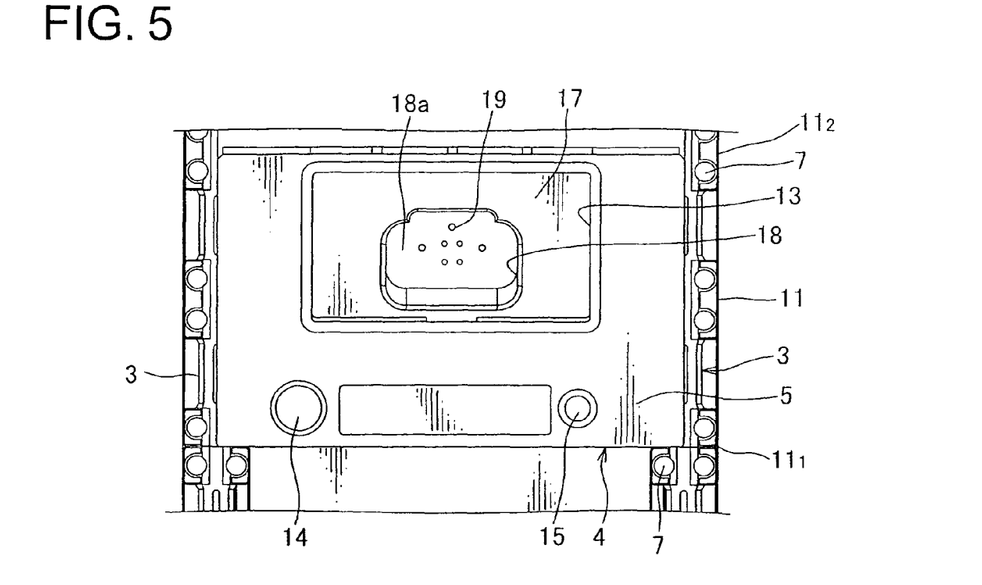
FIG. 5 is a top view of the continuity testing unit mounted to the joint block.
Figure 6:
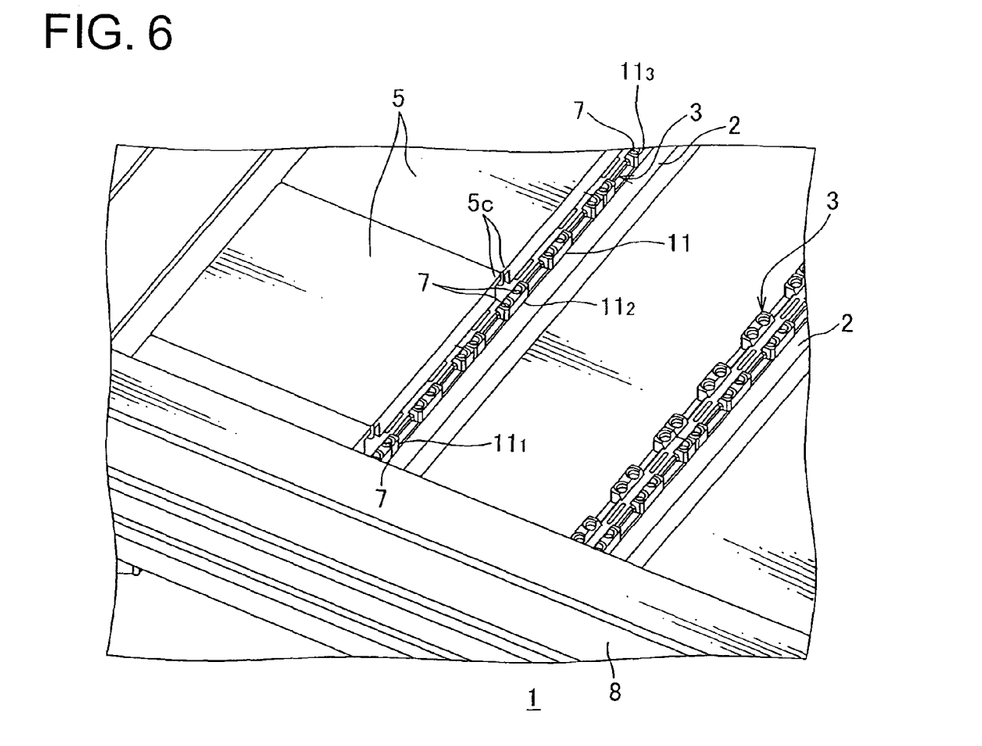
FIG. 6 is a perspective view of the continuity testing unit mounted to the joint block.
Figure 7:
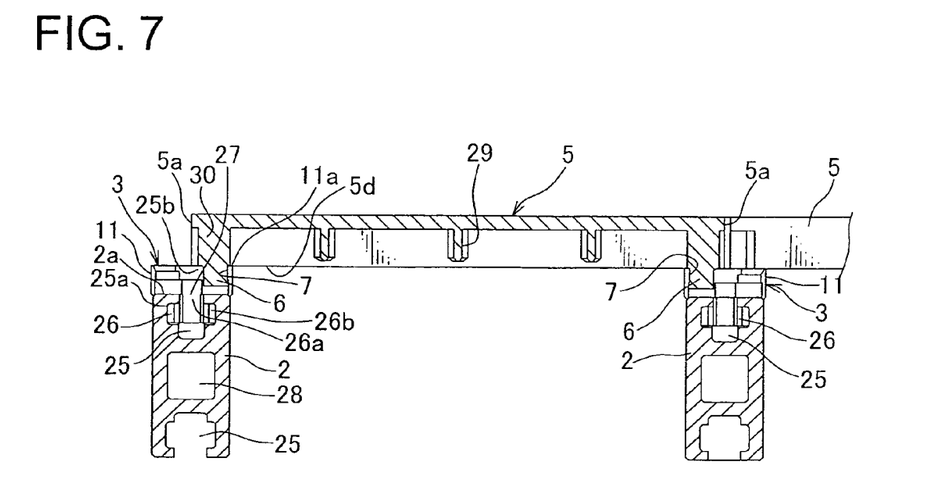
FIG. 7 is a vertical cross-sectional view of the continuity testing unit mounted to the joint block.

As shown in FIGS. 1A, 1B and 2, for the mounting structure for a continuity testing unit according to the present invention, a test board (continuity testing device) 1 is provided with a plurality of rails 2, an elongated joint block 3 arranged on an upper face of the respective rails 2. As shown in FIGS. 3 and 4, a horizontal plate portion 5 of a continuity testing unit 4 is provided with pin portions 6. The pin portions 6 are arranged at four corners of the plate portion 5, respectively, and are arranged to be press-fitted into holes 7 of the joint block 3, respectively. Thus, the continuity testing unit 4 is fixed to the rail 2 via the joint block 3, as shown in FIGS. 5 through 7. In addition, the continuity testing unit 4 fixed to the joint block 3 can be removed from the joint block 3 by lifting the plate portion 5 of the continuity testing unit 4 in the upward direction.

More specifically, referring to FIG. 1A, the test board 1 includes a horizontal rectangular frame 8, a plurality of legs 9 extending downward from the frame 8, a display 10 arranged on the rear side of the frame 8 and the plurality of rails 2 extending in the frame 8 along a front-rear direction and arranged parallel to each other at an equal interval in the right-left direction. The "front-rear direction" described above as well as the expressions "the front", "the rear", "the right" and "the left" are interpreted in relation to a view by a worker. For example, in this embodiment, the worker may stand at the front of the test board 1 when mounting the continuity testing unit 4 on the rails 2, so the front-rear direction corresponds to the lengthwise direction of the rail 2 (i.e. a direction from the lower left side to the upper right side in FIG. 1A). In addition, the width of the rail 2, the joint block 3 and a later-described block portion 11 corresponds to a dimension along the right-left direction.

In an alternative embodiment, the test board 1 of FIG. 1A may be replaced by a test board 1' (shown in FIG. 1B) having the horizontal rectangular frame 8 and a vertical rectangular frame 8' combined together. In this alternative embodiment, the rail 2 may be arranged horizontally at the lower frame 8 and vertically at the upper frame 8' so as to allow the pin portion 6 of the plate portion 5 to be fitted into the hole 7 of the joint block 3 on the respective rails 2.

The frame 8 is made of metal, the rail 2 is made of aluminum and the joint block 3 is made of synthetic resin. The leg 9 located at the rear may be arranged longer than the leg 9 located at the front so that the frame 8 and the rails 2 are slanted forward. The plurality of continuity testing units 4 is arranged along the joint blocks 3 on the rails 2 in a matrix in the right-left and the front-rear directions.

Depending on an arrangement of a connector of a wire harness (not shown), a dummy plate (not shown) may be used instead of the plate portion 5 at the location of the test board 1 where no continuity testing unit 4 is required. Similar to the plate portion 5, the dummy plate is provided with pin portions arranged at four corners of the dummy plate, the pin portion of the dummy plate being formed similar to that of the plate portion 5 of the continuity testing unit 4. The display 10 displays information needed when performing the continuity test, such as a type of a wire harness, an item number, a test result, a circuit list or a connection state of the continuity testing unit 4.

Referring to FIG. 2, the joint block 3 is arranged on an upper face 2a of the respective rails 2. The joint block 3 includes a relatively wide block portion 11 having substantially the same width as the rail 2 and a relatively narrow connecting portion 12 arranged at a widthwise center of the block portion 11 to connect the block portions 11 along the front-rear direction. In this embodiment, the block portion 11 includes total of four holes 7 arranged on the front, rear, right and left sides of the block portion 11 (so the holes 7 are arranged in two lines in the lengthwise direction of the joint block 3). The connecting portion 12 has relatively narrow width such that the upper face 2a of the rail 2 is partially exposed. A specific structure of the joint block 3 is described in more detail below with reference to FIGS. 7 through 9.

For each of the block portions 11, the holes 7 are arranged at an equal interval in the lengthwise direction of the rail 2 (i.e. the front-rear direction), and are arranged in a symmetrical manner in the widthwise direction of the rail 2 (i.e. the right-left direction). The rails 2 are arranged at an equal interval in the right-left direction. In FIG. 2, the two plate portions 5 indicated by a dotted line are arranged on the right and the left of the rail 2 so as to be displaced with respect to each other in the front-rear direction.

As shown in FIG. 2, each of the right and the left plate portions 5 is arranged over four block portions 11 on the respective rails 2. Specifically, for the left plate portion 5, the pin portion 6 located on the right front side of the left plate portion 5 is arranged to engage with a hole $7_1$ located on the rear side of a frontmost block portion 11 of four block portions 11 for the left plate portion 5. Furthermore, the pin portion 6 located on the right rear side of the left plate portion 5 is arranged to engage with a hole $7_2$ located on the front side of the rearmost block portion 11 of the four block portions 11 for the left plate portion 5. Meanwhile, for the right plate portion 5, the pin portion 6 on the left front side of the right plate portion 5 is arranged to engage with a hole $7_3$ located on the rear side of the frontmost block portion 11 of four block portions 11 for the right plate portion 5, while the pin portion 6 on the left rear side of the right plate portion 5 is arranged to engage with a hole $7_4$ located on the front side of the rearmost block portion 11 of the four block portions 11 for the right plate portion 5.

Referring to FIGS. 3 and 4, the continuity testing unit 4 is provided with the above-described horizontal upper plate portion 5 made of synthetic resin, a rectangular aperture 13 formed at a central region of the plate portion 5, an operation button 14 arranged on the left front side of the plate portion 5 and an indication lamp 15 arranged on the right front side of the plate portion 5. The continuity testing unit 4 is further provided with a continuity testing unit main body 16 arranged under the plate portion 5. The continuity testing unit main body 16 includes a plastic case (indicated by the sign 16) having therein a connector mounting part 17 and a continuity testing part (not shown) arranged under the connector mounting part 17.

Referring also to FIG. 5, the connector mounting part 17 includes a block portion (indicated by the sign 17) made of synthetic resin, the block portion having a connector insertion aperture 18 opening upward and formed smaller than the aperture 13 and a plurality of probe-pin insertion holes 19 penetrating through a bottom wall 18a of the connector insertion aperture 18. The connector mounting part 17 further includes a lock part (not shown) and a lock drive part (not shown), the lock part being arranged to engage with an upper face of the connector (not shown) inserted into the connector insertion aperture 18. The lock part and the lock drive part are placed inside of a vertical tubular portion 20 of the case of the continuity testing unit main body 16.

The above-described continuity testing part (not shown) arranged in the continuity testing unit main body 16 includes a block portion made of synthetic resin, a plurality of vertical probe pins extending upward from the block portion of the continuity testing part and an air cylinder (a drive part) arranged to move the block portion of the continuity testing part and the probe pins upward with respect to the connector mounting part.

Referring again to FIG. 3, respective vertically-extending end faces 5a of a later-described upper plate portion (also indicated by the sign 5a) of the plate portion 5 located on the right and the left sides of the plate portion 5 are arranged to be positioned at the widthwise center of each of the adjacent two joint blocks 3. Thus, the width of the plate portion 5 of the continuity testing unit 4 is slightly narrower than the distance from an outer edge of one joint block 3 to an outer edge of the other joint block 3 located adjacent to the one joint block 3.

Referring to FIGS. 3 and 4, the plate portion 5 includes the relatively thick upper plate portion 5a and a relatively thin lower plate portion 5b. The upper plate portion 5a includes an engagement claw 22 extending downward from the upper plate portion 5a. This engagement claw 22 includes a claw portion 22a curved inward to engage with a lower face of the lower plate portion 5b. The lower plate portion 5b is provided with the cylindrical pin portions 6 projecting downward from four corners of the lower plate portion 5b, respectively. Alternatively, the pin portions 6 may be arranged to project downward from a lower face of the upper plate portion 5a so as to penetrate through circular holes (not shown) formed on the lower plate portion 5b. The lower plate portion 5b is formed integrally with the case of the continuity testing unit main body 16 and is formed as a flange of the case of the continuity testing unit main body 16. The upper and the lower plate portions 5a and 5b are engaged to each other using the engagement claw 22, thus the continuity testing part and the connector mounting part 17 are received inside the case of the continuity testing unit main body 16 and covered with the upper plate portion 5a to be fixed and protected.

The respective pin portions 6 are located in the vicinity of the four corners of the plate portion 5, respectively. In fact, the respective pin portions 6 are arranged somewhat inward with respect to the respective corners. The plate portion 5 is arranged to extend longer than the case of the rectangular continuity testing unit main body 16 in the front-rear and right-left directions, so the plate portion 5 forms a flange with respect to the peripheral walls 23 of the case of the continuity testing unit main body 16. In addition, the plate portion 5 is also referred to as a guide portion. In FIG. 3, an arrow A indicates a direction of insertion of the pin portion 6 into the hole 7. In FIG. 4, there is shown a reinforcement rib 24 connecting the lower plate portion 5b and the case of the continuity testing unit main body 16.

Referring to the embodiment shown in FIG. 5, the plate portion 5 of the continuity testing unit 4 of FIGS. 3 and 4 is arranged across three block portions 11 of the respective joint blocks 3 (as described above, for the embodiment of FIG. 2, the plate portion 5 is arranged across the four block portions 11). In this embodiment of FIG. 5, for example, the pin portion 6 located on the right front side of the plate portion 5 is fitted to the hole 7 located on the rear side of the frontmost block portion $11_1$ of the three block portions 11. Furthermore, the pin portion 6 located on the right rear side of the plate portion 5 is fitted to the hole 7 located on the front side of the rearmost block portion $11_2$ of the three block portions 11.

An embodiment shown in FIG. 6 corresponds to the embodiment shown in FIG. 2. In FIG. 6, the plurality of plate portions 5 of the continuity testing device 4 is arranged adjacent to each other on the joint blocks 3 on the two adjacent rails 2 along the lengthwise direction of the rail 2 (the plate portions 5 may be in contact with each other). In this embodiment, the plate portion 5 includes a flange portion 5c projecting from front and rear edges of the plate portion 5, respectively, and lying in the same plane with an upper face of the plate portion 5. The flange portion 5c of the front plate portion 5 is arranged adjacent to the flange portion 5c of the rear plate portion 5 (possibly in a contacted manner). The pin portions 6 are located at the four corners of the plate portion 5 but not at the flange portion 5c.

As shown in FIG. 6, each of the front and the rear plate portions 5 is arranged across the four block portions 11 of the joint block 3. For the front plate portion 5, the pin portion 6 located on the front side of the front plate portion 5 is fitted to the hole 7 located on the rear side of the frontmost block portion $11_1$ of the above-described four block portions 11 for the front plate portion 5, while the pin portion 6 located on the rear side of the front plate portion 5 is fitted to the hole 7 located on the front side of the rearmost block portion $11_2$ of the above-described four block portions 11 for the front plate portion 5. Similarly, for the rear plate portion 5, the pin portion 6 located on the front side of the rear plate portion 5 is fitted to the hole 7 located on the rear side of a frontmost block portion $11_2$ of four block portions 11 for the rear plate portion 5 (thus the rearmost block portion $11_2$ for the front plate portion 5 and the frontmost lock portion $11_2$ for the rear plate portion 5 are the same), while the pin portion 6 located on the rear side of the rear plate portion 5 is fitted to the hole 7 located on the front side of the rearmost block portion $11_3$ of the four block portions 11 for the rear plate portion 5.

Depending on an arrangement of the connectors of the wire harness, some of the plate portions 5 arranged at the test board 1 may be replaced by the dummy plate. In the case of placing the right and the left plate portions 5 in a displaced manner in the front-rear direction, as shown in FIG. 2, there may be provided a space between the plate portion 5 and the frame 8 at the longitudinal ends of the rail 2. Preferably, this space may be covered with a short dummy plate. In addition, there may be provide a space between the adjacent plate portions 5 located along the front-rear direction at a middle of the rail 2.

Referring to FIG. 7, each of the rails 2 is provided with a groove 25 formed at an upper portion of the rail 2. The joint block 3 is provided with a projection 26 formed at a lower portion of the joint block 3 and having an inverted T-shaped cross-section. This projection 26 of the joint block 3 is arranged to slidably engage with the groove 25 of the rail 2 to fix the joint block 3 to the rail 2. The groove 25 has a cross-shaped cross-section and includes a horizontal groove section 25a extending in the right-left direction and a vertical groove section 25b. An upper end of the vertical groove section 25b opens on the upper face 2a of the rail 2. Alternatively, the groove 25 may have an inverted T-shaped cross-section corresponding to the shape of the projection 26.

The projection 26 includes a vertical section 26a and a horizontal section 26b extending perpendicularly from the vertical section 26a in the right and the left directions in a flanged manner. The vertical section 26b of the projection 26 is perpendicularly communicated with and integrally formed with a widthwise center of an upper half portion 27 of the joint block 3. The upper half portion 27 of the joint portion 3 is defined to include the block portion 11 and the connecting portion 12.

The projection 26 of the joint block 3 engages with the groove 25 of the rail 2 in a slidable manner. Thus, the joint block 3 can be easily attached to or removed from the rail 2. Furthermore, the joint block 3 is arranged over the entire length of the rail 2. Thus, for example, by arranging front and rear end faces of the rail 2 and of the joint block 3 to be supported by inner faces of the frame 8 of FIG. 1, respectively, the joint block 3 can be fixed to the rail 2. Alternatively, the joint block 3 may be fixed to the rail 2 by press-fitting the joint block 3 into the rail 2.

In the embodiment shown in FIG. 7, the rail 2 includes two grooves 25 described above each formed at the upper portion of the rail 2 and a lower portion of the rail 2 in a symmetrical manner. Furthermore, the rail 2 is provided with a rectangular lightening hole 28 at a center of the rail 2, the lightening hole 28 penetrating through the rail 2 in a horizontal direction. Since the rail 2 is formed symmetric in the vertical direction, the joint block 3 can be attached to any one of the upper and lower portions of the rail 2. It is also possible to attach the joint blocks 3 having different shapes (e.g. different in a pitch or a diameter of the hole 7) to the upper and the lower portions of the rail 2, respectively. In this case, the desirable joint block 3 may be selected by turning over the rail 2. Furthermore, the rail 2 may be attached to the frame 8 shown in FIG. 1 by inserting a rectangular pin (not shown) into longitudinal ends of the lightening hole 28 of the rail 2.

The plate portion 5 is fixed to the joint block 3 by fitting the right and the left pin portions 6 of the single plate portion 5 into the holes 7 of the block portion 11 of the respective joint blocks 3 on the right and the left rails (that is, the right and the left pin portions 6 of the single plate portion 5 are fitted into the right hole 7 of the left block portion 11 and the left hole 7 of the right block portion 11, respectively). The depth of the hole 7 is formed longer than the length of the pin portion 6. Furthermore, a lower face 5d of the plate portion 5 adjacent to the pin portion 6 is arranged in contact with an upper face 11a of the block portion 11, thus the plate portion 5 is stably supported by the upper face 11a of the block portion 11.

An insertion distance (length) of the pin portion 6 inserted into the hole 7 is relatively small, such that the pin portion 6 can easily be fitted into or separated from the hole 7 by pushing or lifting the plate portion 5 with a relatively small force. Alternatively, the above-described insertion distance may even be zero. In addition, the pin portion 6 may be formed into a tapered-shape such that a diameter of the pin portion 6 is gradually reduced towards a tip of the pin portion 6.

In the embodiment shown in FIG. 7, there is provide a plurality of reinforcement ribs 29 formed at an inner side of the plate portion 5 in the right-left and the front-rear directions. Furthermore, the pin portion 6 is integrally formed with vertical peripheral walls 30 of the plate portion formed on the front, the rear, the right and the left sides of the plate portion 5. Thus, the vertical peripheral walls 30 function to receive the pushing force and the pulling force applied to the peripheral walls 30 during the fitting and the removal of the pin portion 6 with respect to the hole 7, thereby preventing the plate portion 5 from being deformed. Thus, the plate portion 5 can reliably be fitted into and removed from the hole 7.

As shown in FIG. 7, a left end of the upper plate portion 5a is arranged to protrude from the plate portion 5 further to the left than the pin portion 6 located on the left on the plate portion 5, so that the left end of the upper plate portion 5a is located at the widthwise center (in fact somewhat to the right of the widthwise center) of the left joint block 3. Similarly, a right end of the upper plate portion 5a is arranged to protrude from the plate portion 5 further to the right than the pin portion 6 located on the right on the plate portion 5, so that the right end of the upper plate portion 5a is located at the widthwise center (in fact somewhat to the left of the widthwise center) of the right joint block 3. Thus, the plate portions 5 located next to each other in the right-left direction can be arranged adjacent to each other without a space between each other.

Referring now to FIGS. 8, 9A, 9B and 9C, there is shown a short joint block 3 made of synthetic resin. In use, the plurality of short joint blocks 3 are contacted to each other at a mid-division face 11b of the block portion 11 of the respective short joint blocks 3 in the lengthwise direction of the joint block 3, thereby forming the joint block 3 having a suitable length.

Figure 9A:
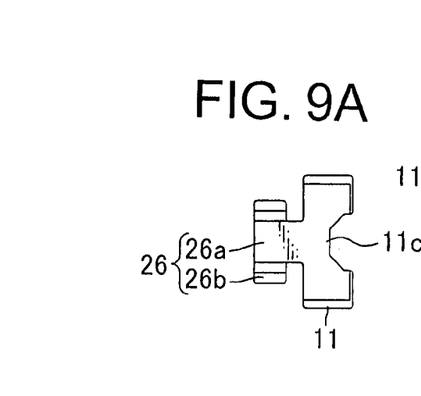
FIG. 9A is a front view of the joint block of FIG. 8.
Figure 9B:
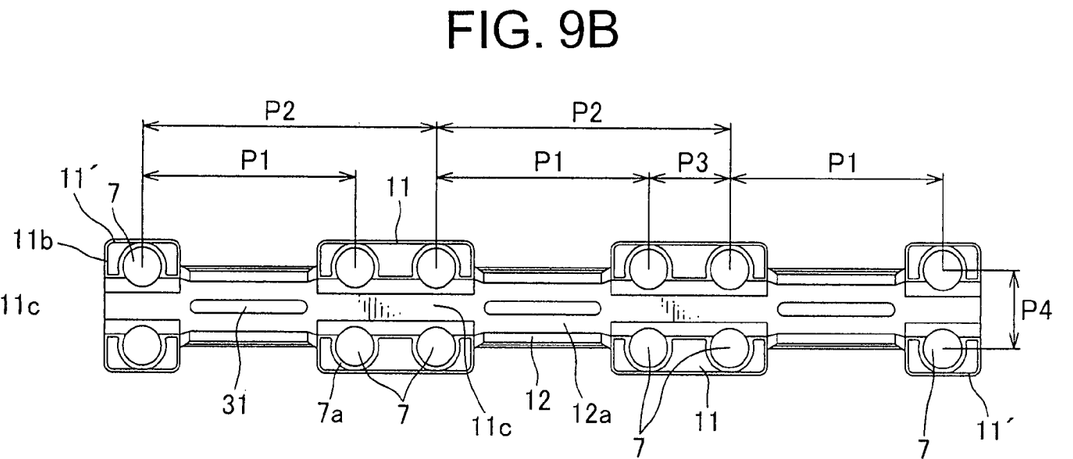
FIG. 9B is a top view of the joint block of FIG. 8.

Referring particularly to FIG. 9B, there are provided a short block portion 11' at both longitudinal ends of the joint block 3. Each of the block portions 11' includes a pair of holes 7. Also, there are provide plurality of long block portions 11 (two block portions 11 each formed twice as long as the block portion 11', in this embodiment) located in the middle of the joint block 3 in the lengthwise direction. The respective block portions 11 include pairs of holes 7 (two pairs, in this embodiment). Each of the block portions 11' on both longitudinal ends of the joint block 3 may be attached to the block portion 11' of another joint block 3 to form one block portion 11. Furthermore, the respective holes 7 are arranged to penetrate through the block portion 11 in the vertical direction. Furthermore, the respective holes 7 are provided with a tapered guide face 7a arranged at an upper end of the hole 7 to guide the pin portion 6 to be smoothly inserted into the hole 7. The connecting portion 12 is connected to the widthwise center of the block portions 11 to connect the block portions 11 to each other. The respective connecting portions 12 have the same length, thus the block portions 11 are connected with an equal interval between each other. In addition, the length of the block portion 11 is formed slightly longer than that of the connecting portion 12.

As shown in FIG. 9B, a distance (pitch) P1 between the hole 7 of the block portion 11' at the front end of the joint block 3 and the hole 7 located on the front side of the block portion 11 located next to the block portion 11' at the front end (hereafter called the second block portion 11), a distance P1 between the hole 7 located on the rear side of the second block portion 11 and the hole 7 located on the front side of the block portion 11 located next to the second block portion 11 (hereafter called the third block portion 11), and a distance P1 between the hole 7 located on the rear side of the third block portion 11 and the hole 7 of the block portion 11' at the rear end of the joint block 3 are equal to each other.

Furthermore, a distance (pitch) P2 between the hole 7 of the block portion 11' at the front end and the hole 7 located on the rear side of the second block portion 11 and a distance P2 between the hole 7 located on the rear side of the second block portion 11 and the hole 7 located on the rear side of the third block portion 11 are equal to each other. Similarly, a distance between the hole 7 of the block portion 11' at the rear end and the hole 7 located on the front side of the third block portion 11 and a distance between the hole 7 located on the front side of the third block portion 11 and the hole 7 located on the front side of the second block portion 11 are the same as the distance P2.

In the embodiment shown in FIG. 9B, a distance P3 between the holes 7 located on the front and the rear sides of the block portion 11 is the same for the respective block portions 11 at the middle of the joint block 3. The distance P3 is smaller than the distance P1. The respective connecting portions 12 are provided with a slit aperture 31 arranged at the widthwise center of the connecting portion 12 and penetrating through the connecting portion 12 in the vertical direction.

Figure 8:
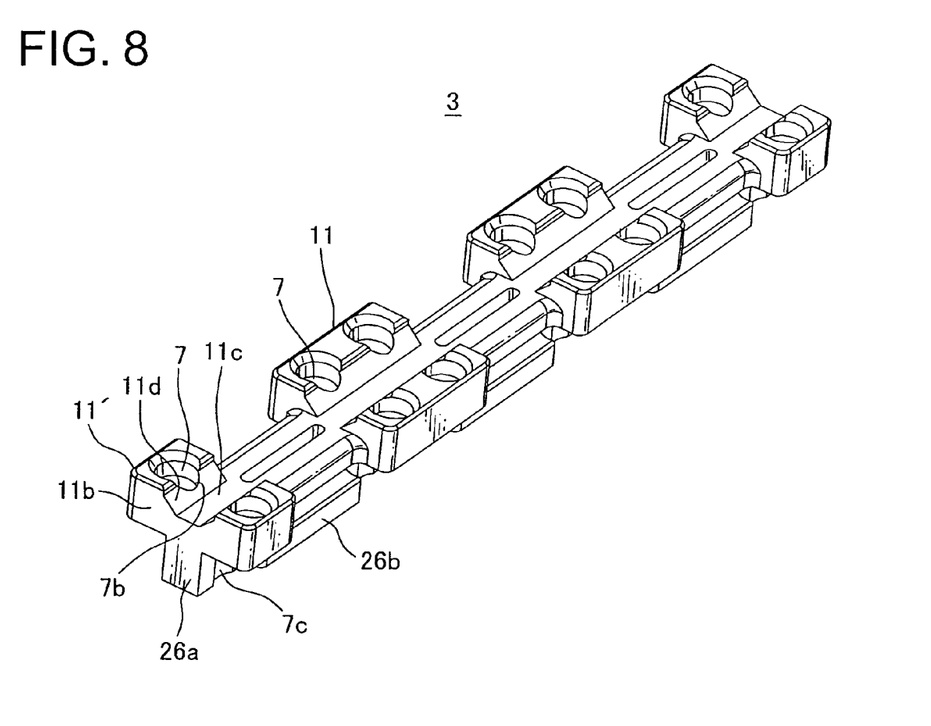
FIG. 8 is a perspective view of the joint block according to one embodiment.

Referring particularly to FIGS. 8 and 9A, the block portion 11 is arranged to protrude further upward (higher) than the connecting portion 12. The block portion 11 includes a V-shaped groove having a bottom face 11c and slant faces 11d arranged on the right and the left sides of the bottom face 11c. The bottom face 11c is located at the widthwise center of the block portion 11 and has the same height as an upper face 12a of the connecting portion 12. The respective holes 7 located at the right and the left sides of the block portion 11 are formed partially on the slant faces 11d, respectively. In this way, an exposed portion 7b of the hole 7 exposed on the slant face 11d helps the pin portion 6 to be smoothly inserted into the hole 7. For example, for the plate portion 5 of the continuity testing unit 4 mounted to the block portion 11 (so the plate portion 5 is in the mounted state as shown for example in FIG. 5), a rod or the like (not shown) may be inserted into the groove 11c to lift the plate portion 5 upward. In that way, the pin portion 6 can be easily separated from the hole 7. In addition, the claw portion 22a of the engagement claw 22 (FIG. 4) located between the pin portions 6 located on the front and the rear sides of the plate portion 5 is positioned in the groove 11c, thus the claw portion 22a can be prevented from interfering with the block portion 11.

Figure 9C:
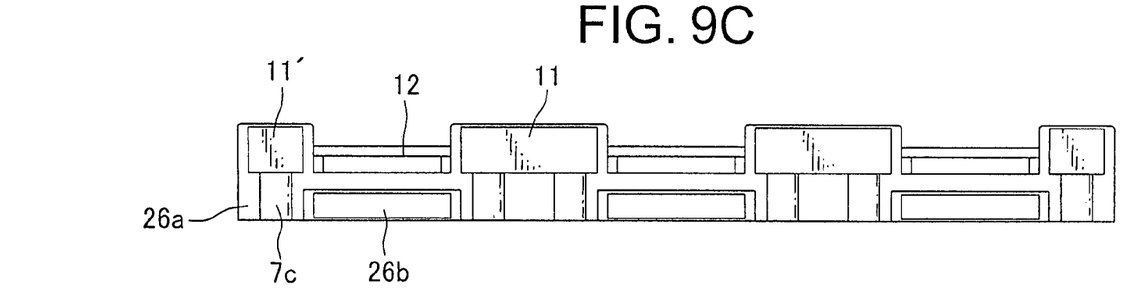
FIG. 9C is a side view of the joint block of FIG. 8.

Referring particularly to FIGS. 8, 9A and 9C, the above-described vertical section 26a of the projection 26 is formed integrally with the block portion 11 and the connecting portion 12. In addition, the vertical section 26a of the projection 26 is arranged continuously across lower faces of the block portion 11 and the connecting portion 12 along the widthwise center. At each connecting portion 12, the horizontal section 26b of the projection 26 projects from a lower portion of the vertical section 26a in the right-left direction, as shown in FIG. 9A. In such a manner, the vertical section 26a and the horizontal section 26b of the projection 26 together form the inverted T-shaped cross-section of the projection 26 to slidably engage with the groove 25. In addition, the hole 7 of the block portion 11 is partially formed by cutting off the vertical section 26a of the projection 26. In other words, the vertical section 26a is provided with an arc-like groove 7a forming the hole 7 and extending down to a lower end of the vertical section 26a.

As described above, by providing the holes 7 on the right and the left sides of the same block portion 11, the width of the joint block 3 can be downsized. Furthermore, by providing the holes 7 on the front and the rear sides of the single block portion 11, the pin portion 6 located on the rear side of the front plate portion 5 can be inserted into the hole 7 located on the front side of the block portion 11 while inserting the pin portion 6 located on the front side of the rear plate portion 5 into the hole 7 located on the rear side of the same block portion 11. Thus, the length of the joint block 3 can be downsized as well. Consequently, the plate portions 5 of the continuity testing units 4 can be arranged close to each other in a matrix in the front-rear and the right-left directions, thereby downsizing the mounting structure of the continuity testing unit 4. Furthermore, the above-described arrangement of the holes 7 of the block portion 11 of the joint block 3 advantageously serves as a guide for the worker in memorizing the positional arrangement of the plate portions 5. Thus, the mounting arrangement of the plate portions 5 can be restored easily and effectively.

Furthermore, at a left end of the test board 1 shown in FIG. 1, the pin portions 6 may be fitted into the holes 7 located on the right side of the joint block 3 only. Similarly, at a right end of the test board 1, the pin portions 6 may be fitted into the holes 7 located on the left side of the joint block 3 only. Alternatively, there may be provided a joint block (not shown) having the holes 7 aligned only in a single line at the right and left ends of the test board 1.

For the embodiments described above, the four pin portions 6 arranged at the four corners of the plate portion 5 are simultaneously inserted into the respective holes 7 of the two adjacent joint blocks 3 to achieve the smooth and stable insertion of the pin portions 6 and to improve the stability of the mounted continuity testing unit 4. However, even though it is less efficient in the workability, it is possible to provide only two pin portions 6 at diagonal corners of the plate portion 5, or it is also possible to provide only two pin portions 6 each at a center of respective right and left edges of the plate portion 5. In the latter case, there may be provided a long joint block 3 including the holes 7 arranged one by one at an equal interval, or, it is also possible to use the holes 7 arranged at an interval corresponding to the distance P2 of the joint block 3 shown in FIG. 9B.

Furthermore, in the above-described embodiments, the plurality of relatively short joint blocks 3 are connected along the lengthwise direction to correspond with the length of the rail 2. However, there may be provided only one long joint block 3 having the same length as the rail 2 (in this case, if it is difficult to form the long joint block 3 by resin molding, then aluminum material may be used).

Furthermore, in the above-described embodiments, the rails 2 are arranged in parallel with the widthwise direction (i.e. shorter dimension) of the frame 8 as shown in FIG. 1. However, in case of arranging the rails 2 in parallel with the lengthwise direction (i.e. longer dimension) of the frame 8, then the length of the rail 2 may be arranged to correspond with the dimension of the frame 8 in the lengthwise direction. In this case, the pin portions 6 located on the front and the rear sides of the plate portion 5 are inserted into the holes 7 of the joint block 3 on the rail 2. In addition, depending of the size of the continuity testing unit 4, the rails 2 may be arranged at unequal intervals.

Furthermore, in the above-described embodiments, the holes 7 arranged in two lines are provided to each of the block portions 11 connected to each other by the connecting portion 12 at an equal interval. However, it is possible to eliminate the connecting portion 12 by forming the width of the joint block 3 to be the same as that of the block portion 11, as well as by providing the holes 7 arranged at an equal interval in two lines along the length of the joint block 3. In this case, however, it may be difficult to restore the mounting arrangement of the continuity testing units 4 with the holes 7 arranged at an equal interval for the entire length of the joint block 3, since it is difficult for the worker to effectively memorize the location of the continuity testing unit 4 based on the location of the block portions 11.

As described above, the mounting structure according to the present invention is advantageous in effectively mounting or removing the continuity testing unit for the respective connectors of the wire harness, thereby improving the efficiency of the continuity test for the different types of the wire harness.

Furthermore, the structures disclosed in the above-described embodiments are advantageous not only as the mounting structure for the continuity testing unit but as the continuity testing device (the test board) or as the mounting or removing method of the continuity testing unit.

The embodiments described herein are only representative embodiments and are not intended to limit the present invention. It will be understood that various modifications to the embodiments may be made without departing the scope of the present invention.

What is claimed is:

1. A mounting structure for a continuity testing unit, comprising:
a frame;
a plurality of rails arranged parallel to each other at the frame;
a joint block arranged on each of the rails; and
a plurality of continuity testing units each including a plate portion and protruding portions formed at the plate portion,
wherein the protruding portions are arranged on both sides of the plate portion of the continuity testing unit,
wherein the joint block is provided with a plurality of holes into which the protruding portions are fitted in a disengageable manner, the plurality of holes being arranged in two lines, and
wherein the each side of the plate portion is placed on each of the joint blocks arranged on the adjacent two rails.

2. The mounting structure for a continuity testing unit according to claim 1, wherein the protruding portions are arranged at four corners of the plate portion.

3. The mounting structure for a continuity testing unit according to claim 1, wherein the joint block is provided with an engagement portion arranged to slidably engage with a groove of the rail.

4. The mounting structure for a continuity testing unit according to claim 2, wherein the joint block is provided with an engagement portion arranged to slidably engage with a groove of the rail.

5. The mounting structure for a continuity testing unit according to claim 1, wherein the joint block includes a plurality of block portions and a connecting portion connecting the block portions at an equal interval, wherein the block portion includes holes on front and rear sides and on right and left sides of the block portion.

6. The mounting structure for a continuity testing unit according to claim 2, wherein the joint block includes a plurality of block portions and a connecting portion connecting the block portions at an equal interval, wherein the block portion includes holes on front and rear sides and on right and left sides of the block portion.

7. The mounting structure for a continuity testing unit according to claim 3, wherein the joint block includes a plurality of block portions and a connecting portion connecting the block portions at an equal interval, wherein the block portion includes holes on front and rear sides and on right and left sides of the block portion.

8. The mounting structure for a continuity testing unit according to claim 4, wherein the joint block includes a plurality of block portions and a connecting portion connecting the block portions at an equal interval, wherein the block portion includes holes on front and rear sides and on right and left sides of the block portion.

9. The mounting structure for a continuity testing unit according to claim 1, wherein the joint block is provided with a projection formed at a lower portion of the joint block and having an inverted T-shaped cross-section.

10. The mounting structure for a continuity testing unit according to claim 9, wherein the projection of the joint block is arranged to slidably engage with a groove of the rail to fix the joint block to the rail.

11. The mounting structure for a continuity testing unit according to claim 10, wherein the groove has a cross-shaped cross-section and includes a horizontal groove section and a vertical groove section.

12. The mounting structure for a continuity testing unit according to claim 11, wherein
- the projection includes a vertical section and a horizontal section extending perpendicularly from the vertical section in a flanged manner, and
- the vertical section of the projection is perpendicularly communicated with and integrally formed with a widthwise center of an upper half portion of the joint block which includes a block portion of the joint block and a connecting portion of the joint block.

* * * * *